United States Patent
Lee (10) Patent No.: US 9,560,750 B2
(45) Date of Patent: Jan. 31, 2017

(54) DISPLAY DEVICE

(71) Applicant: SAMSUNG DISPLAY CO., LTD., Yongin, Gyeonggi-Do (KR)

(72) Inventor: Sangwol Lee, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 7 days.

(21) Appl. No.: 14/681,232

(22) Filed: Apr. 8, 2015

(65) Prior Publication Data

US 2016/0100478 A1  Apr. 7, 2016

(30) Foreign Application Priority Data

Oct. 6, 2014 (KR) ................. 10-2014-0134488

(51) Int. Cl.
*H05K 1/02* (2006.01)
*H04M 1/02* (2006.01)
*G06F 1/16* (2006.01)

(52) U.S. Cl.
CPC ............ *H05K 1/028* (2013.01); *G06F 1/1601* (2013.01); *G06F 1/1624* (2013.01); *G06F 1/1626* (2013.01); *G06F 1/1652* (2013.01); *H04M 1/0202* (2013.01); *G06F 2200/1612* (2013.01); *G06F 2203/04102* (2013.01); *H05K 2201/051* (2013.01); *H05K 2201/10106* (2013.01)

(58) Field of Classification Search
CPC combination set(s) only.
See application file for complete search history.

(56) References Cited

U.S. PATENT DOCUMENTS

| | | | |
|---|---|---|---|
| 7,830,333 B2* | 11/2010 | Aoki | G06F 1/1601 345/1.3 |
| 7,965,258 B2* | 6/2011 | Aoki | G06F 1/1601 345/1.3 |
| 8,009,421 B2* | 8/2011 | Misawa | G02F 1/133305 345/156 |
| 8,009,422 B2* | 8/2011 | Misawa | G02F 1/133305 345/156 |
| 8,363,393 B2* | 1/2013 | Bemelmans | G06F 1/1601 248/917 |
| 8,644,010 B2* | 2/2014 | Mullen | G06F 1/1624 345/8 |
| 8,787,008 B2* | 7/2014 | Walters | G06F 1/1641 248/917 |
| 9,019,313 B2* | 4/2015 | Kwack | G06F 1/1652 345/173 |
| 2006/0007368 A1 | 1/2006 | Slikkerveer et al. | |

(Continued)

FOREIGN PATENT DOCUMENTS

KR  10-2014-0028216 A   3/2014
WO  WO 2008/054206 A2   5/2008

*Primary Examiner* — Lisa Lea Edmonds
(74) *Attorney, Agent, or Firm* — Lee & Morse, P.C.

(57) ABSTRACT

A display device includes a first housing, a second housing separable from the first housing, a display panel in the first housing and connected to the second housing, the display panel being pulled out from the first housing when the second housing moves away from the first housing, and a support member in the second housing and connected to the first housing, the support member supporting the display panel and being pulled out from the second housing when the first housing moves away from the second housing.

18 Claims, 6 Drawing Sheets

(56) References Cited

U.S. PATENT DOCUMENTS

| | | | |
|---|---|---|---|
| 2007/0216639 A1* | 9/2007 | LaFarre | G02F 1/167 345/107 |
| 2008/0013292 A1* | 1/2008 | Slikkerveer | G06F 1/1601 361/749 |
| 2008/0211733 A1* | 9/2008 | Huitema | G02F 1/133305 345/3.1 |
| 2010/0064564 A1 | 3/2010 | Bemelmans et al. | |
| 2010/0177020 A1* | 7/2010 | Bemelmans | G09F 9/00 345/55 |
| 2011/0043976 A1 | 2/2011 | Visser et al. | |
| 2012/0050075 A1* | 3/2012 | Salmon | G06F 1/1626 341/20 |
| 2012/0168009 A1* | 7/2012 | Chen | G09F 9/301 137/560 |
| 2012/0204453 A1 | 8/2012 | Jung | |
| 2013/0128439 A1 | 5/2013 | Walters et al. | |
| 2014/0042293 A1 | 2/2014 | Mok et al. | |
| 2014/0194165 A1* | 7/2014 | Hwang | G06F 1/1677 455/566 |
| 2014/0218375 A1* | 8/2014 | Kim | G06F 3/147 345/501 |
| 2014/0247544 A1* | 9/2014 | Ryu | G09F 11/18 361/679.01 |
| 2014/0268532 A1* | 9/2014 | Nicol | G09F 15/0062 361/679.26 |
| 2015/0009636 A1* | 1/2015 | Jeong | B65H 18/10 361/749 |

\* cited by examiner

DISPLAY DEVICE

CROSS-REFERENCE TO RELATED APPLICATION

Korean Patent Application No. 10-2014-0134488, filed on Oct. 6, 2014, in the Korean Intellectual Property Office, and entitled: "Display Device," is incorporated by reference herein in its entirety.

BACKGROUND

1. Field

One or more exemplary embodiments relate to a device, and more particularly, to a display device.

2. Description of the Related Art

Electronic devices based on mobility are widely used. Tablet PCs, as well as small electronic devices, e.g., mobile phones, have recently been used as mobile electronic devices.

Such a mobile, i.e., portable, electronic device includes a display unit that displays visual information, e.g., an image, to a user. As other parts of the mobile electronic device for driving the display unit have recently been made compact, a volume which the display unit occupies in the mobile electronic device has gradually increased, and a structure that may bend at a predetermined angle from a flat state has been developed.

SUMMARY

According to one or more exemplary embodiments, a display device includes a first housing, a second housing separable from the first housing, a display panel in the first housing and connected to the second housing, the display panel being pulled out from the first housing when the second housing moves away from the first housing, and a support member in the second housing and connected to the first housing, the support member supporting the display panel and being pulled out from the second housing when the first housing moves away from the second housing.

The display device may further include a control board that is connected to the display panel and is disposed in the first housing or the second housing.

The display device may further include a battery that is disposed in the first housing or the second housing and is electrically connected to the control board.

The display device may further include a roller that is disposed in at least one selected from the first housing and the second housing, wherein at least one selected from the display panel and the support member is wound around the roller or unwound from the roller.

The roller may include: a first roller that is disposed in one from among the first housing and the second housing, wherein one from among the display panel and the support member is wound around the first roller or unwound from the first roller; and a second roller that is disposed in the other from among the first housing and the second housing, wherein the other from among the display panel and the support member is wound around the second roller or unwound from the second roller.

The display device may further include an elastic unit that applies a restoring force to the roller.

The display device may further include a driver that rotates the roller to wind or unwind at least one selected from the display panel and the support member around or from the roller.

At least one selected from the display panel and the support member may be provided to slide along at least one selected from an inner surface of the first housing and an inner surface of the second housing.

The display device may further include a sliding portion that is connected to at least one selected from the display panel and the support member and moves along at least one selected from the inner surface of the first housing and the inner surface of the second housing.

The display device may further include a stopper that is provided in at least one selected from the first housing and the second housing and limits a path of the sliding portion.

The display device may further include a guide portion that is formed on at least one selected from the inner surface of the first housing and the inner surface of the second housing and guides a movement of the sliding portion.

The support member may be a metal foil.

The display device may further include an insulating member that is disposed between the support member and the display panel.

The display panel may be an organic light-emitting display panel.

The display panel may be flexible.

The display panel may include: a substrate; a display unit that is formed on the substrate; and a thin-film encapsulation layer that is formed on the display unit and encapsulates the display unit.

The substrate may be formed of polyimide (PI).

The thin-film encapsulation layer may have a structure in which at least one selected from an organic layer and an inorganic layer is stacked.

The second housing may include a support protrusion on which at least a portion of the support member is seated and supported.

The display panel may be pulled out from the first housing in a first direction and the support member may be pulled out from the second housing in a second direction that is opposite to the first direction.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms "first", "second", etc. may be used herein to describe various elements, these elements should not be limited by these terms. These elements are only used to distinguish one element from another.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

Figure 1:
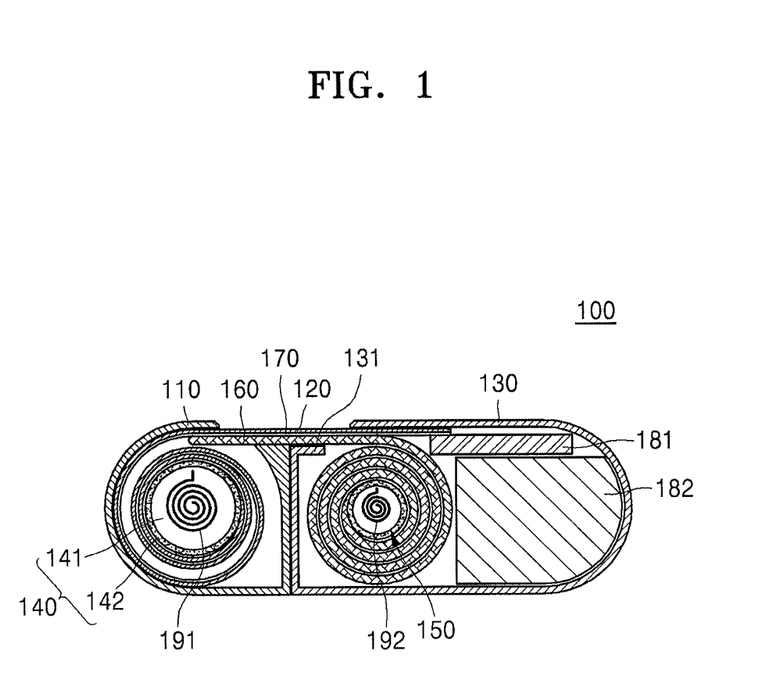
FIG. 1 illustrates a cross-sectional view of a display device according to an exemplary embodiment.
Figure 2:
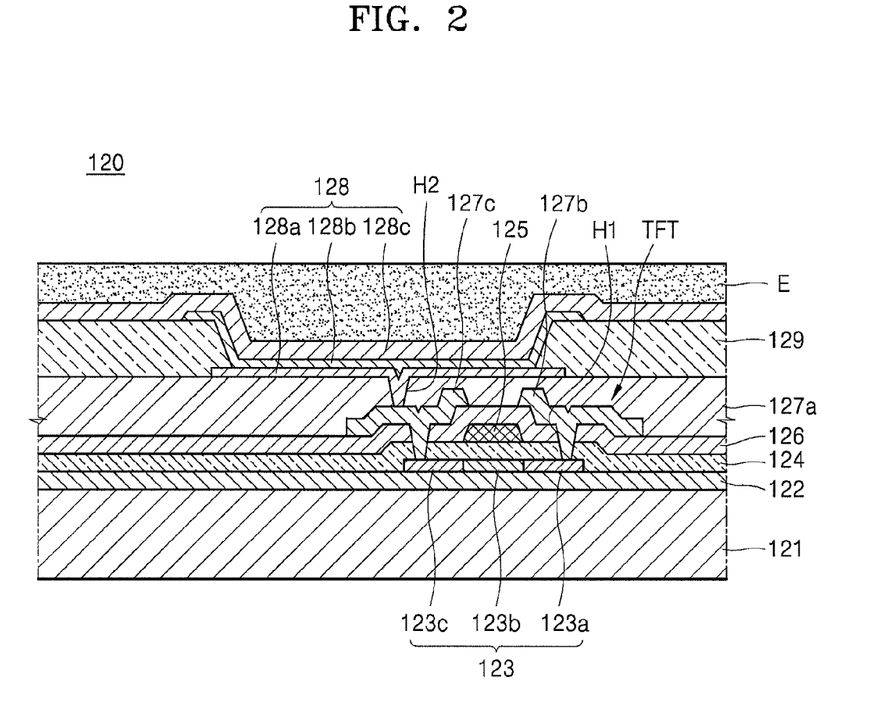
FIG. 2 illustrates a cross-sectional view of a portion of a display panel of FIG. 1, according to an exemplary embodiment.
Figure 3:
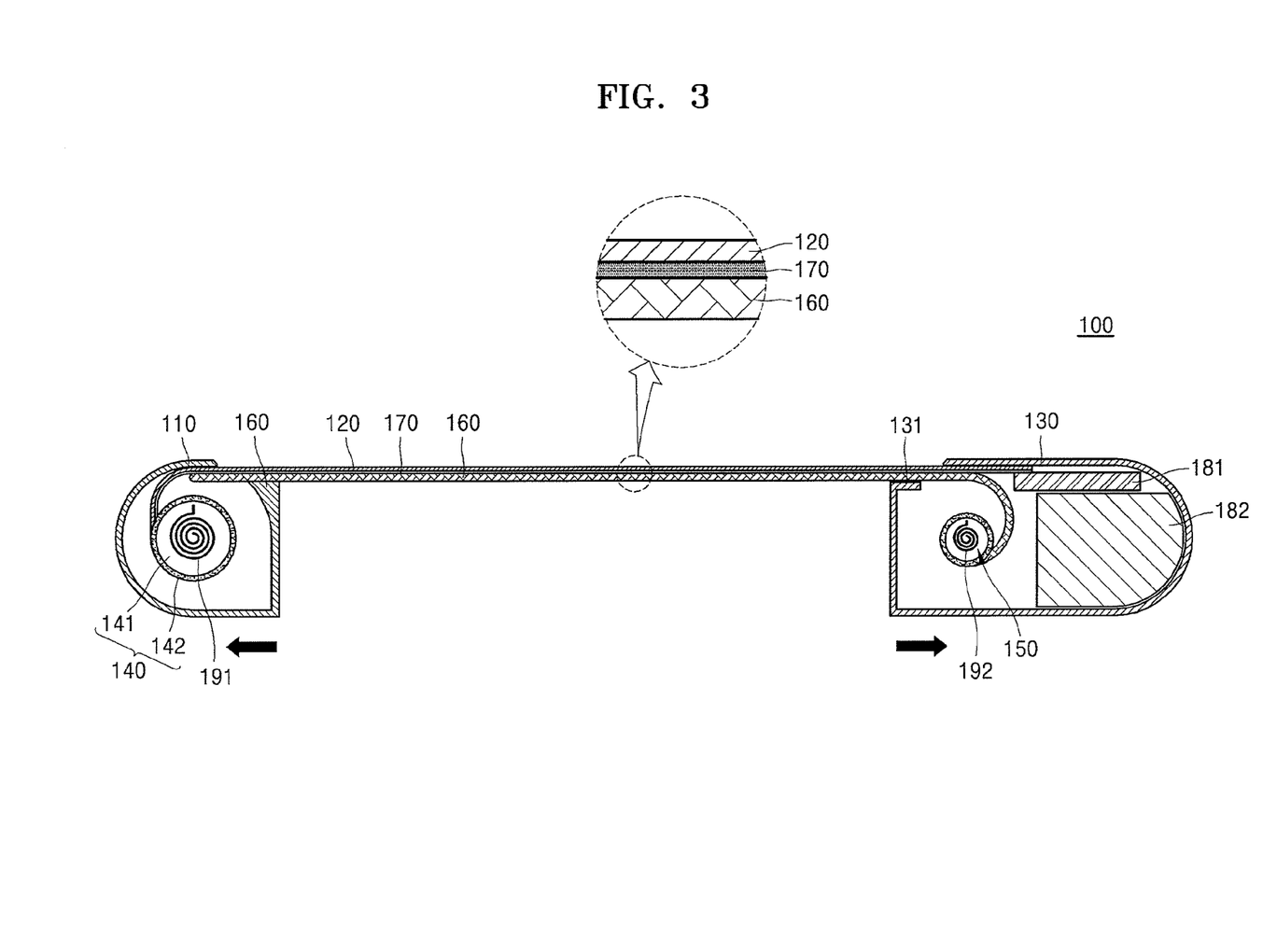
FIG. 3 illustrates a cross-sectional view for explaining an operation of the display device of FIG. 1, according to an exemplary embodiment.

FIG. 1 is a cross-sectional view illustrating a display device 100 according to an exemplary embodiment. FIG. 2 is a cross-sectional view illustrating a portion of a display panel 120 of FIG. 1, according to an exemplary embodiment. FIG. 3 is a cross-sectional view for explaining an operation of the display device 100 of FIG. 1, according to an exemplary embodiment.

Referring to FIGS. 1 through 3, the display device 100 may include a first housing 110, a second housing 130, at least one roller, the display panel 120, an insulating member 170, a support member 160, a control board 181, a battery 182, and an elastic unit (not shown).

A space may be formed in the first housing 110, and a first roller 140 and the display panel 120 may be inserted into the space that is formed in the first housing 110. The first housing 110 may be formed so that at least a portion of the first housing 110 is curved.

The second housing 130 may be separated from the first housing 110. For example, each of the first and second housings 110 and 130 may include separate sidewalls, so the first and second housings 110 and 130 may be pulled away from each other to a predetermined distance. In this case, a space may be formed in the second housing 130, and the support member 160 and a second roller 150 may be inserted into the space that is formed in the second housing 130. The second housing 130 may be formed so that at least a portion of the second housing 130 is curved. Also, the second housing 130 may include a support protrusion 131 that supports the support member 160 when the support member 160 is pulled. In this case, the support protrusion 131 may be formed in a direction that is parallel to a direction in which the support member 160 is pulled. For example, the space in the first housing 110 may be independent of the space in the second housing 130.

The display panel 120 may be pulled out from the first housing 110. In this case, a first end from among ends of the display panel 120 may be fixed to the first roller 140 inside the first housing 110, and a second end from among the ends of the display panel 120 may be connected to the second housing 130, e.g., the second end from among the ends of the display panel 120 may be fixed to at least one of the second housing 130 and the control board 181. As such, movement of the second housing 130 away from the first housing 110 may pull the display panel 120 out of the first housing 110 to a predetermined distance, so a user may see and use the display panel 120.

The display panel 120 may include a substrate 121 (FIG. 2) and a display unit (not shown). Also, the display panel 120 may include a thin-film encapsulation layer E that is formed on the display unit (FIG. 2). The display panel 120 will now be described in more detail with reference to FIG. 2.

Referring to FIG. 2, the display unit of the display panel 120 may be formed on the substrate 121. In this case, the display unit may include a thin-film transistor (TFT), a passivation film 127a may be formed to cover the TFT, and an organic light-emitting diode (OLED) 128 may be formed on the passivation film 127a.

In this case, the substrate 121 may be formed of e.g., a plastic material, or polyimide (PI). The following will be described in detail on the assumption that the substrate 121 is formed of a PI for convenience of explanation.

A buffer layer 122 formed of an organic compound and/or an inorganic compound, e.g., $SiO_x$ (x≥1) or $SiN_x$ (x≥1), may be further formed on a top surface of the substrate 121. After an active layer 123 having a predetermined pattern is formed on the buffer layer 122, the active layer 123 is covered by a gate insulating layer 124. The active layer 123 has a source region 123a, a drain region 123c, and a channel region 123b that is formed between the source region 123a and the drain region 123c. The active layer 123 may be formed to include various materials. For example, the active layer 123 may include an inorganic semiconductor material, e.g., amorphous silicon or crystalline silicon. In another example, the active layer 123 may include an oxide semiconductor. In yet another example, the active layer 123 may include an organic semiconductor material. However, the following will be described in detail on the assumption that the active layer 123 is formed of amorphous silicon for convenience of explanation.

The active layer 123 may be formed by forming an amorphous silicon film on the buffer layer 122, forming a polycrystalline silicon film by crystallizing the amorphous silicon film, and patterning the polycrystalline silicon film. The source region 123a and the drain region 123c of the active layer 123 are doped with impurities according to a type of the TFT, e.g., a driving TFT (not shown) or a switching TFT (not shown).

A gate electrode 125 that corresponds to the active layer 123 and an interlayer insulating layer 126 that covers the gate electrode 125 are formed on a top surface of the gate insulating layer 124. After a contact hole H1 is formed in the interlayer insulating layer 126 and the gate insulating layer 124, a source electrode 127b and a drain electrode 127c are formed on the interlayer insulating layer 126 to respectively contact the source region 123a and the drain region 123c.

The passivation film 127a is formed on the TFT, and a pixel electrode 128a of the OLED 128 is formed on the passivation film 127a. The pixel electrode 128a contacts the drain electrode 127c of the TFT through a via hole H2 that is formed in the passivation film 127a. The passivation film 127a may be formed of an inorganic material and/or an organic material to have a single-layer or multi-layer structure. The passivation film 127a may be formed so that a top surface is planarized and a bottom surface is curved, or may be formed so that a top surface is curved along a curved bottom surface. For example, the passivation film 127a is formed of a transparent insulating material in order to achieve resonance.

After the pixel electrode 128a is formed on the passivation film 127a, a pixel-defining film 129 is formed by using an organic material and/or an inorganic material to cover the pixel electrode 128a and the passivation film 127a. A portion of the pixel electrode 128a is opened to be exposed through the pixel-defining film 129.

An intermediate layer 128b and a counter electrode 128c are formed on at least the exposed portion of the pixel electrode 128a. The pixel electrode 128a functions as an anode, whereas the counter electrode 128c functions as a cathode. However, polarities of the pixel electrode 128a and the counter electrode 128/c may be changed, and the pixel electrode 128a may function as a cathode and the counter electrode 128c may function as an anode.

The pixel electrode 128a and the counter electrode 128c are insulated from each other due to the intermediate layer 128b, and apply different voltages to the intermediate layer 128b to enable an organic emission layer to emit light. For example, the intermediate layer 128b may include the organic emission layer. In another example, the intermediate layer 128b may include the organic emission layer, and may further include at least one of a hole injection layer (HIL), a hole transport layer (HTL), an electron transport layer (ETL), and an electron injection layer (EIL).

One unit pixel includes a plurality of subpixels, and the plurality of subpixels may emit light of different colors. For example; the plurality of subpixels may include subpixels that emit red, green, and blue light, or may include subpixels that emit red, green, blue, and white light.

The thin-film encapsulation layer E may include a plurality of inorganic layers, or may include an inorganic layer and an organic layer. The organic layer of the thin-film encapsulation layer E may be formed of a polymer, and may be a single film or a stacked film formed of at least one of, e.g., polyethyleneterephthalate (PET), PI, polycarbonate, epoxy, polyethylene, and polyacrylate.

For example, when the organic layer is formed of polyacrylate, the polyacrylate layer may be formed by polymerizing a monomer composition including a diacrylate-based monomer and a triacrylate-based monomer. A monoacrylate-based monomer may be further included in the monomer composition. Also, a photoinitiator, e.g., 2,4,6-trimethylbenzoyldiphenylphosphine oxide (TPO), may be further included in the monomer composition, but the present exemplary embodiment is not limited hereto.

The inorganic layer of the thin-film encapsulation layer E may be a single film or a stacked film including a metal oxide or a metal nitride. In detail, the inorganic layer may include at least one of, e.g., $SiN_x$, $Al_2O_3$, $SiO_2$, and $TiO_2$.

An uppermost layer of the thin-film encapsulation layer E which is exposed to the outside may be an inorganic layer in order to prevent moisture penetrating into the OLED 128.

For example, the thin-film encapsulation layer E may include at least one sandwich structure in which at least one organic layer is inserted between at least two inorganic layers. In another example, the thin-film encapsulation layer E may include at least one sandwich structure in which at least one inorganic layer is inserted between at least two organic layers. In yet another example, the thin-film encapsulation layer E may include a sandwich structure in which at least one organic layer is inserted between at least two inorganic layers, and a sandwich structure in which at least one inorganic layer is inserted between at least two organic layers.

For example, the thin-film encapsulation layer E may include a first inorganic layer, a first organic layer, and a second inorganic layer that are sequentially stacked on the OLED 128. In another example, the thin-film encapsulation layer E may include a first inorganic layer, a first organic layer, a second inorganic layer, a second organic layer, and a third inorganic layer that are sequentially stacked on the OLED 128. IN yet another example, the thin-film encapsulation layer E may include a first inorganic layer, a first organic layer, a second inorganic layer, a second organic layer, a third inorganic layer, a third organic layer, and a fourth inorganic layer that are sequentially stacked on the OLED 128.

For example, a halogenated metal layer including LiF may be additionally disposed between the OLED 128 and a first inorganic layer of the thin-film encapsulation layer E. The halogenated metal layer may prevent the OLED 128 from being damaged when the first inorganic layer is formed by using sputtering. For example, the first organic layer may have an area that is less than that of a second inorganic layer, and the second organic layer may have an area that is less than that of a third inorganic layer.

A coating film or a protective film (not shown) may be attached to a surface of the display panel 120 in order to protect the display panel 120 from being damaged or scratched when the display panel 120 contacts an external object, e.g., the first housing 110 or the support member 160. However, the following will be described in detail on the assumption that there is no coating film or protective film on the surface of the display panel 120 for convenience of explanation.

Referring back to FIG. 1, the support member 160 may be provided to be pulled into the second housing 130. In this case, a first end from among ends of the support member 160 may be fixed to the second roller 150. Also, a second end from among the ends of the support member 160 may be fixed to the first housing 110. In this case, the second end from among the ends of the support member 160 may be fixed to an outer surface of the first housing 110, or may be fixed to an inner surface of the first housing 110 by being partially inserted into the first housing 110.

The support member 160 may support the display panel 120 when the display panel 120 is pulled. In this case, the support member 160 may include a material having a sufficient hardness, e.g., a metal material. For example, the support member 160 may be formed as a metal foil.

The insulating member 170 may be disposed between the display panel 120 and the support member 160. In this case, the insulating member 170 may be provided on at least one of the display panel 120 and the support member 160. The insulating member 170 may include an insulating-material, e.g., polyurethane or PET.

The insulating member 170 may be formed as any of various types. For example, the insulating member 170 may be formed as a film and may be attached to at least one of the display panel 120 and the support member 160. In another example, the insulating member 170 may be coated on at least one of the display panel 120 and the support member 160. Also, the insulating member 170 may be formed as a separate plate, and may be fixedly attached to at least one of the display panel 120 and the support member 160. The insulating member 170 may insulate the display panel 120 from the support member 160 when the display panel 120 is pulled out from the first housing 110.

The roller may be provided in at least one of the first housing 110 and the second housing 130. In this case, the roller may allow at least one of the display panel 120 and the support member 160 to be wound therearound or unwound therefrom.

For example, as described previously, the roller may include the first roller 140 that is provided in the first housing 110 and the second roller 150 that is provided in the second housing 130. In another example, the first roller 140 and the second roller 150 may be optionally provided, e.g., only the first roller 140 may be provided in the first housing 110 or only the second roller 150 may be provided in the second housing 130. However, the following will be described in detail on the assumption that the first roller 140 and the second roller 150 are respectively provided in the first housing 110 and the second housing 130.

The elastic unit for applying a restoring force to the roller while the roller rotates may be provided on the roller. The elastic unit may include a first elastic unit 191 that is provided on the first roller 140 and a second elastic unit 192 that is provided on the second roller 150.

The first roller 140, the second roller 150, the first elastic unit 191, and the second elastic unit 192 will now be explained in detail.

The first roller 140 may allow the display panel 120 to be wound therearound or unwound therefrom. In this case, the display panel 120 may be wound around the first roller 140 so that the display unit (not shown) does not contact an outer surface of the first roller 140.

The first roller 140 may include a first roller body 141 that is provided in the first housing 110 and rotates, and a first insulator 142 that is provided to surround the first roller body 141. In this case, the first insulator 142 may include an insulating material, e.g., polyurethane or PET. For example, as illustrated in FIG. 1, when the display panel 120 is wound on the first roller 140, the first insulator 142 is between the display panel 120 and the first roller body 141. Further, when the display panel 120 is wound on the first roller 140, the first insulator 142 may, e.g., directly, contact a portion of a surface of the substrate 121 on which the display unit is not formed.

The first elastic unit 191 may be provided on the first roller 140. In this case, the first elastic unit 191 may include a torsion spring. In particular, a first end of the first elastic unit 191 may be connected to the first roller body 141, and a second end of the first elastic unit 191 may be connected to the first housing 110. The first elastic unit 191 may apply a restoring force to the first roller 140 in a direction that is opposite to a direction in which the first roller 140 rotates when the display panel 120 is unwound from the first roller 140.

The support member 160 may be wound around the second roller 150 or unwound from the second roller 150. In this case, the second roller 150 may be formed similarly to the first roller 140. A detailed explanation of the second roller 150 will not be given for convenience of explanation.

The second elastic unit 192 may be disposed on the second roller 150. In this case, when the support member 160 is unwound from the second droller 150, the second elastic unit 192 may apply a restoring force to the second roller 150 in a direction that is opposite to a direction in which the second roller 150 rotates. The second roller 150 is the same as or similar to the first roller 140, and thus a detailed explanation thereof will not be given.

The display device 100 may include a driver (not shown) for driving the roller, instead of the elastic unit. In this case, the driver may wind or unwind each member by rotating the roller. In particular, the driver may include a first driver (not shown) that is provided on the first roller 140 and a second driver (not shown) that is provided on the second roller 150. The following will be described in detail on the assumption that the display device 100 includes the elastic unit for convenience of explanation.

The control board 181 may be electrically connected to the display panel 120 and the battery 182. In this case, the control board 181 may be provided in the first housing 110 or the second housing 130. The following will be described in detail on the assumption that the control board 181 is provided in the second housing 130 for convenience of explanation.

The control board 181 may receive power from the battery 182, and may control the display panel 120. In this case, the control board 181 may be formed identically or similarly to a circuit board or a control board that is generally used in a display field.

The battery 182 may be provided in the first housing 110 or the second housing 130. In this case, the battery 182 and the control board 181 may be provided in the same space. The following will be described in detail on the assumption that the battery 182 is provided in the second housing 130 for convenience of explanation.

The battery 182 may be formed as a rechargeable secondary battery. For example, the battery 182 may be provided to be separated from the second housing 130. In another example, the battery 182 may be provided to be fixed to the second housing 130.

An operation of the display device 100 will now be explained with reference to FIG. 3. The first housing 110 and the second housing 130 may contact each other.

Referring to FIG. 3, when the first housing 110 and the second housing 130 move away from each other, the display panel 120 may be unwound from the first roller 140 to be pulled to the outside of the first housing 110. In this case, the second end from among the ends of the display panel 120 that is fixed to the control board 181 may move along with the second housing 130.

While the display panel 120 moves as described above, the support member 160 may be pulled out from the second housing 130. In this case, the support member 160 may be unwound from the second roller 150.

When the display panel 120 and the support member 160 are respectively pulled out from the first housing 110 and the second housing 130 as described above, the display unit of the display panel 120 may be exposed to the outside and the support member 160 may support the display panel 120. In this case, since the insulating member 170 is disposed between the display panel 120 and the support member 160 (enlarged portion in FIG. 3), the insulating member 170 may insulate the display panel 120 from the support member 160.

When the display panel 120 is completely pulled to the outside as described above, a desired operation may be performed by touching the display panel 120 or a manipulation unit (not shown) that is provided in at least one of the first housing 110 and the second housing 120. Alternatively, a user may manipulate the display panel 120 by using motion, e.g., hand movement or voice.

Once the user manipulates the display device 100, the display panel 120 may display an image. In this case, in order for the display panel 120 to operate, an initial operation, e.g., an operation of turning on a screen, may depend on various signals, e.g., motion, voice, touch, a signal that is input through the manipulation unit, or a separation between the first housing 110 and the second housing 130.

Next, the display panel 120 and the support member 160 may be stored by being respectively inserted into the first housing 110 and the second housing 130. In this case, the first elastic unit 191 and the second elastic unit 192 may respectively apply restoring forces to the first roller 140 and the second roller 150 to rotate the first roller 140 and the second roller 150 and, thus, to respectively wind the display panel 120 and the support member 160 around the first roller 140 and the second roller 150.

Accordingly, the display unit 100 may have minimize volume when it is not used, thereby improving portability and operability. Also, the display device 100 may store the display panel 120 by using a simple structure.

Figure 4:
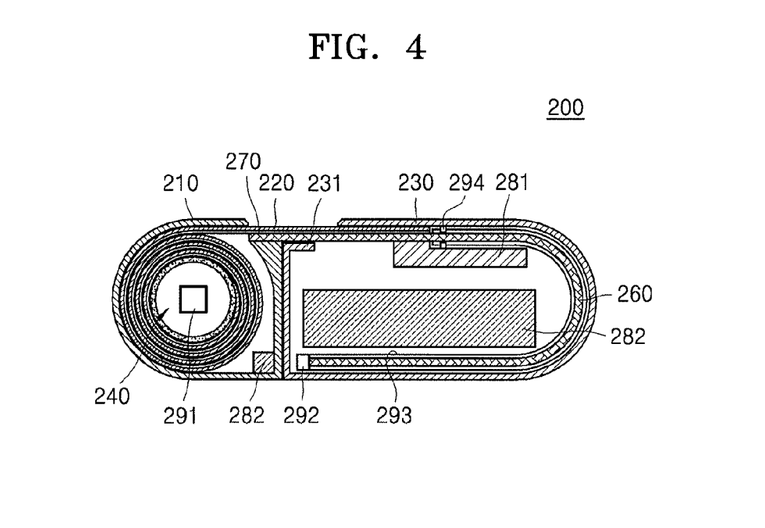
FIG. 4 illustrates a cross-sectional view of a display device according to another exemplary embodiment.
Figure 5:
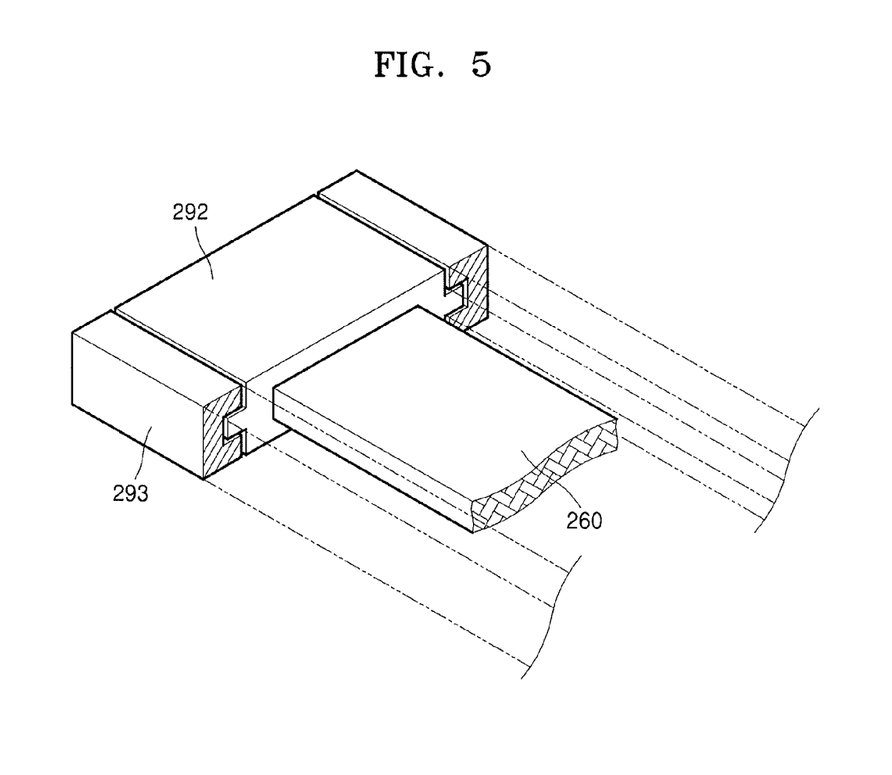
FIG. 5 illustrates a partial perspective view of a sliding portion and a guide portion of FIG. 4, according to an exemplary embodiment.
Figure 6:
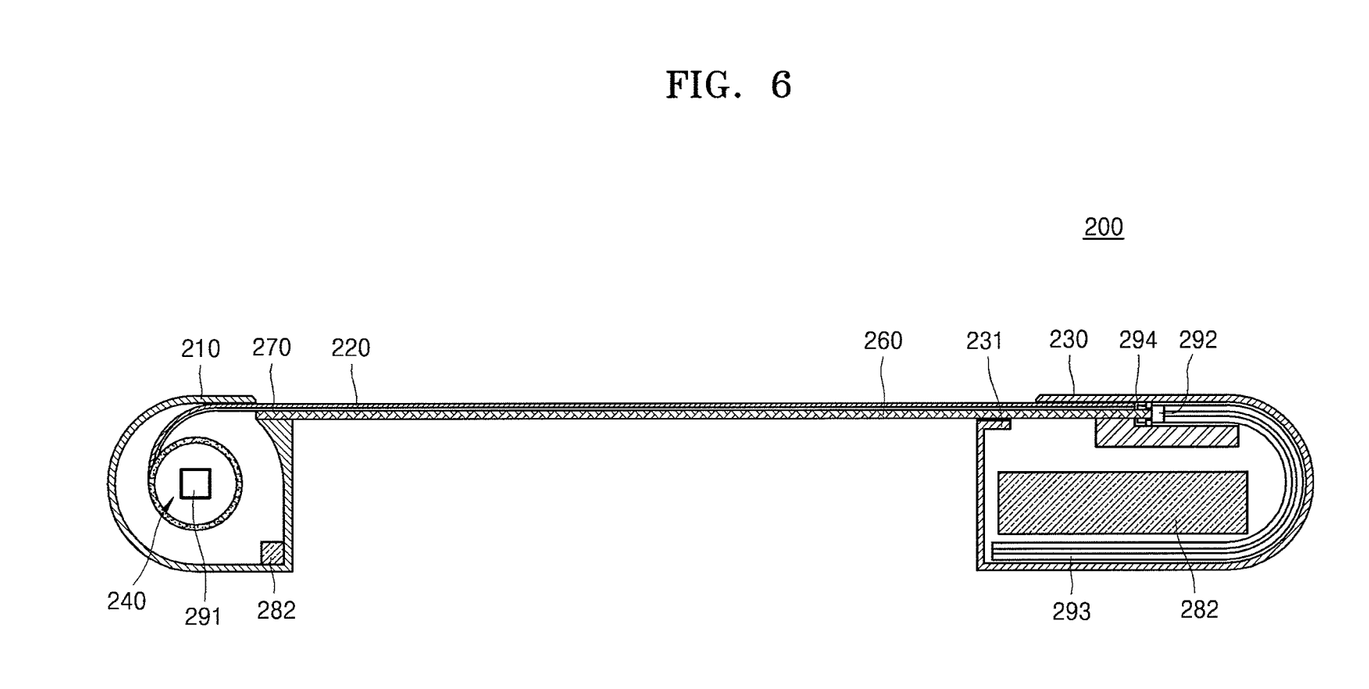
FIG. 6 illustrates a cross-sectional view for explaining an operation of the display device of FIG. 4, according to an exemplary embodiment.

FIG. 4 is a cross-sectional view illustrating a display device 100 according to another exemplary embodiment. FIG. 5 is a partial perspective view illustrating a sliding portion 292 and a guide portion 293 of FIG. 4, according to an exemplary embodiment. FIG. 6 is a cross-sectional view for explaining an operation of the display device 200 of FIG. 4, according to an exemplary embodiment.

Referring to FIGS. 4 through 6, the display device 200 may include a first housing 210, a second housing 230, a roller, a display panel 220, an insulating member 270, a support member 260, the sliding portion 292, the guide portion 293, a stopper 294, a control board 281, a battery 282, and a driver (not shown). In this case, the first housing 210, the second housing 230, the display panel 220, the insulating member 270, the support member 260, the control board 281, and the battery 282 are the same as or similar to those of FIGS. 1 through 3, and thus a detailed explanation thereof will not be given.

The sliding portion 292 may be provided to be fixed to a second end from among ends of the support member 260. In this case, when the sliding portion 292 moves after being seated or inserted, the guide portion 293 may guide the movement of the sliding portion 292.

In detail, the guide portion 293 may be provided in the second housing 230. The sliding portion 292 and the guide portion 293 may be formed as any of various types. For example, according to an exemplary embodiment, the sliding portion 292 may be formed as a block, and the guide portion 293 may be formed to surround a part of the sliding portion 292. In another example, the sliding portion 292 may be formed as a roller, and the sliding portion 292 may be formed as a rail along which the roller moves. In yet another example, the sliding portion 292 and the guide portion 293 may be formed as linear motion guides. However, the sliding portion 292 and the guide portion 293 are not limited thereto, and may be any apparatuses and structures as long as the sliding portion 292 moves, as the support member 260 moves, while the guide portion 293 guides the movement of the sliding portion 292.

The roller may include a first roller 240 that is disposed in the first housing 210. Also, the driver may include a first driver 291 that is provided on the first roller 240. In this case, the first roller 240 is the same as or similar to that of FIGS. 1 through 3, and thus a detailed explanation thereof will not be given.

The first driver 291 may be electrically connected to the battery 282 and the control board 281, and may rotate the first roller 240 when the display panel 220 is pulled out from the first housing 210 or inserted into the first housing 210. In this case, the first driver 291 may be a general small motor.

Embodiments are not limited thereto. For example, instead of the first driver 291, the first elastic unit 191 of FIGS. 1 through 3 may be used. However, the following will be described in detail on the assumption that the first driver 291 is used for convenience of explanation.

The battery 282 may be provided in the first housing 210 or the second housing 230, or may be provided in both the first housing 210 and the second housing 230. In this case, when the battery 282 is provided in the second housing 230, the battery 282 may be connected to the first driver 291 in a state where a power cable or the like is provided on the support member 260.

The display device 200 may further include the stopper 294 that is provided in the second housing 230. In this case, the stopper 294 may limit a path of the sliding portion 292. For example, the stopper 294 may limit a path of the sliding portion 292 so that when the display panel 220 is completely pulled, the support 260 is no longer pulled. In particular, the stopper 294 may protrude from a specific position of the second housing 230 to limit, i.e., stop, movement of the sliding portion 292. The stopper 294 is not limited thereto, and may include any structure and apparatus for limiting a path of the sliding portion 292, e.g., a compression spring or a rubber that is connected to an end of the sliding portion 292.

The display device 200 may include a second driver (not shown), instead of an elastic unit described with reference to the second roller 150 in FIGS. 1 through 3, to move the support member 260. In this case, the second driver operates identically or similarly to the first driver 291, and thus a detailed explanation thereof will not be given.

An operation of the display device 200 will now be explained. When the first housing 210 and the second housing 230 move away from each other, the display panel 220 and the support member 260 may be respectively pulled out from the first housing 210 and the second housing 230. In this case, the insulating member 270 may be disposed between the support member 260 and the display panel 220. Also, a support protrusion 231 may support the support member 260 when the support member 260 is pulled.

When the support member 260 is pulled as described above, the sliding portion 292 may move along the guide portion 293, and after moving by a predetermined distance, may no longer move due to the stopper 294. Also, the first driver 291 may rotate the first roller 240 to unwind the display panel 220 from the first roller 240. When the display panel 220 is completely pulled as described above, the display panel 220 may perform a desired operation or command through manipulation.

Next, when the first housing 210 and the second housing 230 move closer to each other in order to insert the display panel 220 into the first housing 210, the first driver 291 may operate to wind the display panel 220 around the first roller 240. In this case, when a predetermined signal is generated, e.g., a signal is input through a manipulation unit (not shown), a touch is input through the display panel 220, the first housing 210 and the second housing 230 move closer to each other, or a predetermined force is detected, the first driver 291 may operate.

When the display panel 220 is inserted into the first housing 210 as described above, the sliding portion 292 moves in an opposite direction along the guide portion 293, and the support member 260 moves along an inner surface of the second housing 230 to be inserted into the second housing 230.

Accordingly, since the display device 200 may have minimized volume when it is not used, portability and operability may be improved. Also, the display device 200 may store the display panel 220 by using a simple structure.

Figure 7:
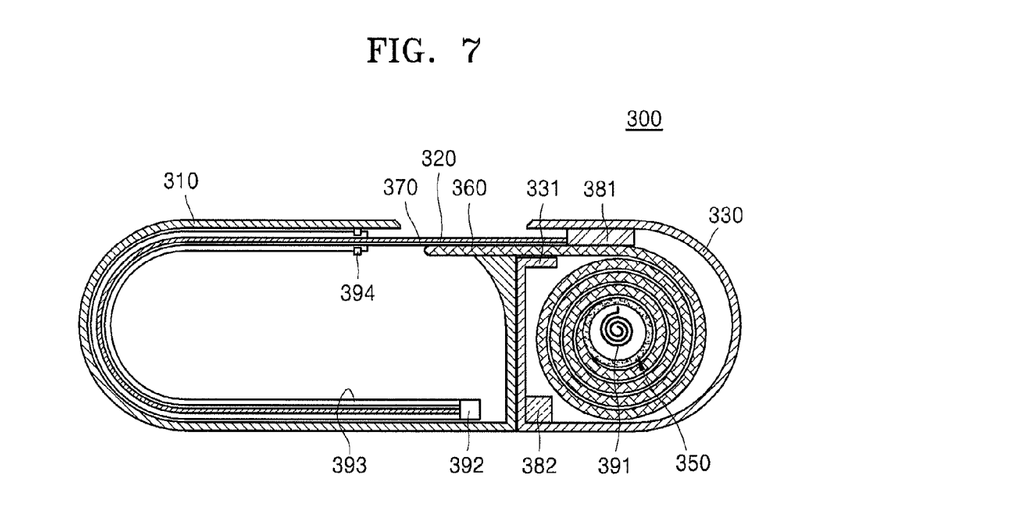
FIG. 7 illustrates a cross-sectional view of a display device according to another exemplary embodiment.

FIG. 7 is a cross-sectional view illustrating a display device 300 according to another exemplary embodiment.

Referring to FIG. 7, the display device 300 may include a first housing 310, a second housing 330, a roller (not shown), an elastic unit (not shown), a display panel 320, an insulating member 370, a support member 360, a sliding portion 392, a guide portion 393, a stopper 394, a control board 381, and a battery 382. In this case, the first housing 310, the second housing 330, the display panel 320, the insulating member 370, the support member 360, the control board 381, and the battery 382 are the same as or similar to those described above, and thus a detailed explanation thereof will not be given.

The roller may include a second roller 350 that is disposed in the second housing 330. In this case, the second roller 350 is the same as or similar to the second roller 150 of FIGS. 1 through 3, and thus a detailed explanation thereof will not be given.

Also, the elastic unit may include a second elastic unit 391 that is provided on the second roller 350. In this case, the second elastic unit 391 is the same as or similar to the second elastic unit 192 of FIGS. 1 through 3, and thus a detailed explanation thereof will not be given.

The sliding portion 392 may be connected to the display panel 320. In this case, the sliding portion 392 may be formed as a block. The sliding portion 392 may be formed identically or similarly to that described with reference to FIGS. 4 through 6, and thus a detailed explanation thereof will not be given.

The sliding portion 392 may move along an inner surface of the first housing 310. In this case, the guide portion 393 may be formed on the inner surface of the first housing 310 and may guide movement of the sliding portion 392. In detail, the guide portion 393 may be formed identically or similarly to that described with reference to FIGS. 4 through 6, and thus a detailed explanation thereof will not be given.

The stopper 394 may be formed in a portion of the first housing 310. In this case, the stopper 394 may be formed on the inner surface of the first housing 310 and may limit a path of the sliding portion 392. In detail, the stopper 394 may limit a maximum movement distance of the sliding portion 392 when the sliding portion 392 moves. In this case, the stopper 394 may be formed identically or similarly to that described with reference to FIGS. 4 through 6, and thus a detailed explanation thereof will not be given.

An operation of the display device 300 will now be explained. When the first housing 310 and the second housing 330 move away from each other, the display panel 320, the insulating member 370, and the support member 360 may be pulled out from the first housing 310 and the second housing 330. In this case, a support protrusion 331 that is provided in the second housing 330 may support the support member 360 when the support member 360 is pulled.

The display panel 320 may be connected to the second housing 330 and thus may move along the inner surface of the first housing 310 as the second housing 330 moves. Also, since the insulating member 370 is attached to the display panel 320, the insulating member 370 may move along with the display panel 320. The sliding portion 392 may be connected to the display panel 320 and may move along the guide portion 393 as the display panel 320 moves. When the display panel 320 is completely pulled, the sliding portion 392 that moves as described above may be limited by the stopper 394 and may no longer move. In this case, the display panel 320 may reach a maximum length.

During the above operation, the support member 360 may be unwound from the second roller 350 and may be pulled to the outside of the second housing 330. In this case, the support member 360 that is connected to the first housing 310 may move as the first housing 310 moves.

When the display panel 320 and the support member 360 are pulled as described above, the support member 360 may support the display panel 320. In this case, the insulating member 370 may be disposed between the display panel 320 and the support member 360 and thus may insulate the display panel 320 from the support member 360.

A method of returning the display device 300 to its original state may be performed in an opposite order. In detail, when the first housing 310 and the second housing 330 move closer to each other, the sliding portion 392 may move along the guide portion 393, and the display panel 320 and the insulating member 370 may be inserted into the first housing 310. In addition, the second elastic unit 391 may apply a restoring force to the second roller 350 to wind the support member 360 around the second roller 350, and the support member 360 may be inserted into the second housing 330.

Accordingly, the display device 300 may have minimized volume, i.e., size, when it is not used, thereby improving portability and operability. Also, the display device 300 may store the display panel 320 by using a simple structure.

Figure 8:
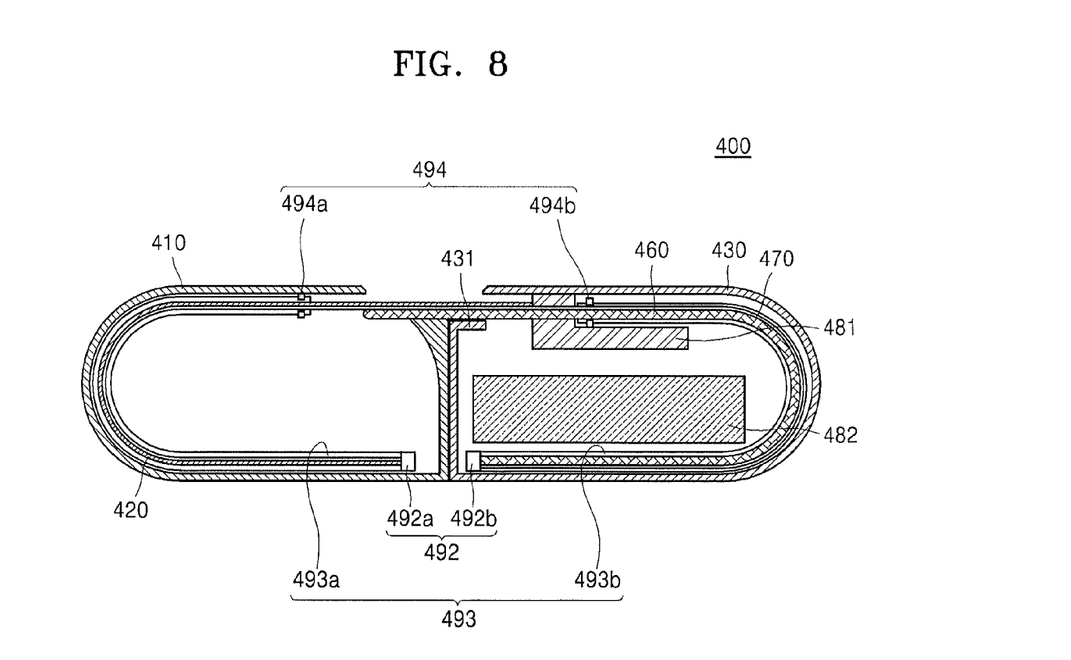
FIG. 8 illustrates a cross-sectional view of a display device according to another exemplary embodiment.

FIG. 8 is a cross-sectional view illustrating a display device 400 according to another exemplary embodiment.

Referring to FIG. 8, the display device 400 may include a first housing 410, a second housing 430, a display panel 420, an insulating member 470, a support member 460, a sliding portion 492, a guide portion 493, a stopper 494, a control board 481, and a battery 482. In this case, the first housing 410, the second housing 430, the display panel 420, the insulating member 470, the support member 460, the control board 481, and the battery 482 are the same as or similar to those described with reference to FIG. 7, and thus a detailed explanation thereof will not be given.

The sliding portion 492 may be connected to at least one of the display panel 420 and the support member 460, and may move along at least one of an inner surface of the first housing 410 and an inner surface of the second housing 430. Also, the stopper 494 may be provided in at least one of the first housing 410 and the second housing 430, and may limit a path of the sliding portion 492. The guide portion 493 may be formed on at least one of the inner surface of the first housing 410 and the inner surface of the second housing 430, and may guide a movement of the sliding portion 492.

In this case, the sliding portion 492 may be connected to one from among the display panel 420 and the support member 460, and may include a first sliding portion 491a that is disposed in one from among the first housing 410 and the second housing 430. Also, the sliding portion 492 may be connected to the other from among the display panel 420 and the support member 460, and may include a second sliding portion 492a that is disposed in the other from among the first housing 410 and the second housing 430. The following will be described in detail on the assumption that the first sliding portion 491a is connected to the display panel 420 and is disposed in the first housing 410, and the second sliding portion 492a is connected to the support member 460 and is disposed in the second housing 430 for convenience of explanation.

The stopper 494 may include a first stopper 494a that is formed in one from among the first housing 410 and the second housing 430. The stopper 494 may include a second stopper 494b that is formed in the other from among the first housing 410 and the second housing 430. In this case, the first stopper 494a and the second stopper 494b may respectively limit movements or movement distances of the first sliding portion 491a and the second sliding portion 492a. The following will be described in detail on the assumption that the first stopper 494a is formed in the first housing 410 to correspond to the first sliding portion 491a, and the second stopper 494b is formed in the second housing 430 to correspond to the second sliding portion 492a for convenience of explanation.

The guide portion 493 may include a first guide portion 493a that is formed on one from among the inner surface of the first housing 410 and the inner surface of the second housing 430. Also, the guide portion 493 may include a second guide portion 493b that is formed on the other from among the inner surface of the first housing 410 and the inner surface of the second housing 430. In this case, the first guide portion 493a and the second guide portion 493b may respectively guide the first sliding portion 491a and the second sliding portion 492a. The following will be described in detail on the assumption that the first guide portion 493a is formed in the first housing 410 to correspond to the first sliding portion 491a, and the second guide portion 493b is formed in the second housing 430 to correspond to the second sliding portion 492a for convenience of explanation.

An operation of the display device 400 will now be explained. When the first housing 410 and the second housing 430 move away from each other, the display panel 420 may be pulled out from the first housing 410. Also, the support member 460 and the insulating member 470 may be pulled out from the second housing 430. In this case, a support protrusion 431 that is provided in the second housing 430 may support the support member 460 when the support member 460 is pulled. Also, the insulating member 470 may be formed as a film and may be attached to a surface of the support member 460.

When the display panel 420 and the support member 460 move as described above, the first sliding portion 491a may move along the first guide portion 493a and the second sliding portion 492a may move along the second guide portion 493b. When the display panel 420 and the support member 460 are respectively pulled out from the first housing 410 and the second housing 430, the first stopper 494a and the second stopper 494b may respectively limit a position of the first sliding portion 491a and a position of the second sliding portion 492a. Accordingly, the display panel 420 and the support member 460 may not be pulled by a predetermined distance or more.

After the display panel 420 is pulled as described above, when the use of the display panel 420 is completed, the display panel 420 and the support member 460 may be respectively inserted into the first housing 410 and the second housing 430. In this case, when the first housing 410 and the second housing 430 move closer to each other, the first sliding portion 491a and the second sliding portion 492a may respectively move along the first guide portion 493a and the second guide portion 493b. Also, the display panel 420 may receive a force from the second housing 430 to be inserted into the first housing 410, and the support member 460 may receive a force from the first housing 410 to be inserted into the second housing 430.

The above operation may be continuously performed until the first housing 410 and the second housing 430 reach their initial positions. Accordingly, the display device 400 may have minimized volume when it is not used, thereby improving portability and operability. Also, the display device 400 may store the display panel 420 by using a simple structure.

As described above, according to the one or more of the above exemplary embodiments, a display device may have a minimized volume, i.e., size, thereby being convenient to carry. In particular, the display device according to embodiments includes a display panel and its support member that are retractable into respective housings when not used, thereby minimizing an overall size of the display device when not in use.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a first housing;
   a second housing separable from the first housing;
   a display panel in the first housing and connected to the second housing, the display panel being pulled out from the first housing when the second housing moves away from the first housing;
   a support member in the second housing and connected to the first housing, the support member supporting the display panel and being pulled out from the second housing when the first housing moves away from the second housing;
   a first roller in the first housing, one of the display panel and the support member being wound on the first roller; and
   a second roller in the second housing, the other one of the display panel and the support member being wound around the second roller.

2. The display device as claimed in claim 1, further comprising a control board connected to the display panel, the control board being in the first housing or the second housing.

3. The display device as claimed in claim 2, further comprising a battery in the first housing or the second housing, the battery being electrically connected to the control board.

4. The display device as claimed in claim 1, further comprising an elastic unit that applies a restoring force to each of the first and second rollers.

5. The display device as claimed in claim 1, further comprising a driver that rotates each of the first and second rollers to wind or unwind the at least one of the display panel and the support member.

6. The display device as claimed in claim 1, wherein at least one of the display panel and the support member slides along at least one of an inner surface of the first housing and an inner surface of the second housing.

7. The display device as claimed in claim 6, further comprising a sliding portion connected to at least one of the display panel and the support member, the sliding portion moving along the inner surface of the first or second housing.

8. The display device as claimed in claim 7, further comprising a stopper in the first housing or the second housing, the stopper limiting a path of the sliding portion.

9. The display device as claimed in claim 7, further comprising a guide portion on at least one of the inner surface of the first housing and the inner surface of the second housing, the guide portion guiding movement of the sliding portion.

10. The display device as claimed in claim 1, wherein the support member is a metal foil.

11. The display device as claimed in claim 1, wherein the display panel is an organic light-emitting display panel.

12. The display device as claimed in claim 1, wherein the display panel is flexible.

13. The display device as claimed in claim 1, wherein the display panel includes:
 a substrate;
 a display unit on the substrate; and
 a thin-film encapsulation layer on the display unit, the thin-film encapsulation layer encapsulating the display unit.

14. The display device as claimed in claim 13, wherein the substrate includes polyimide (PI).

15. The display device as claimed in claim 13, wherein the thin-film encapsulation layer includes at least one of an organic layer and an inorganic layer.

16. The display device as claimed in claim 1, wherein the second housing includes a support protrusion on which at least a portion of the support member is seated and supported.

17. A display device, comprising:
 a first housing;
 a second housing separable from the first housing;
 a display panel in the first housing and connected to the second housing, the display panel being pulled out from the first housing when the second housing moves away from the first housing;
 a support member in the second housing and connected to the first housing, the support member supporting the display panel and being pulled out from the second housing when the first housing moves away from the second housing; and
 an insulating member between the support member and the display panel.

18. A display device, comprising:
 a first housing;
 a second housing separable from the first housing;
 a display panel in the first housing and connected to the second housing, the display panel being pulled out from the first housing when the second housing moves away from the first housing; and
 a support member in the second housing and connected to the first housing, the support member supporting the display panel and being pulled out from the second housing when the first housing moves away from the second housing,
 wherein the display panel is pulled out from the first housing in a first direction, and the support member is pulled out from the second housing in a second direction that is opposite to the first direction.

* * * * *